United States Patent
Wang

(10) Patent No.: US 6,204,127 B1
(45) Date of Patent: Mar. 20, 2001

(54) METHOD OF MANUFACTURING BIT LINES IN MEMORY

(75) Inventor: Ling-Sung Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/313,521

(22) Filed: May 17, 1999

(30) Foreign Application Priority Data

Apr. 27, 1999 (TW) .................................... 88106720

(51) Int. Cl.$^7$ .................................... H01L 21/336
(52) U.S. Cl. ............................ 438/270; 438/270
(58) Field of Search .................... 438/259, 296, 438/270, 597, 598, 618, 589, 706, 710, 719, 691, 692

(56) References Cited

U.S. PATENT DOCUMENTS

| | | | | |
|---|---|---|---|---|
| 5,830,797 | * | 11/1998 | Cleeves | 438/296 |
| 6,027,982 | * | 2/2000 | Peidous et al. | 438/424 |
| 6,040,218 | * | 3/2000 | Lam | 438/259 |
| 6,051,469 | * | 4/2000 | Sheu et al. | 438/270 |
| 6,060,399 | * | 5/2000 | Kim et al. | 438/706 |

* cited by examiner

Primary Examiner—David Nelms
Assistant Examiner—David Nhu
(74) Attorney, Agent, or Firm—Jiawei Huang; J C Patents

(57) ABSTRACT

A method of manufacturing the bit lines of memory. The method includes the steps of forming a mask over a substrate, and then patterning the mask layer to form an opening that exposes a portion of the substrate. Thereafter, a portion of the exposed substrate is removed to form a trench in the substrate. Next, the mask layer is removed. Finally, conductive material is deposited into the trench to form a bit line.

20 Claims, 2 Drawing Sheets

METHOD OF MANUFACTURING BIT LINES IN MEMORY

CROSS-REFERENCE TO RELATED APPLICATION

This application claims the priority benefit of Taiwan application serial no. 88106720, filed Apr. 27, 1999, the full disclosure of which is incorporated herein by reference.

BACKGROUND OF THE INVENTION

1. Field of Invention

The present invention relates to a method of manufacturing mask read-only-memory (ROM). More particularly, the present invention relates to a method that uses a damascene process to manufacture the bit lines of a mask ROM.

2. Description of Related Art

The bit lines of most flat cell mask ROM are formed by implanting ions into a substrate to form a buried layer. However, as the level of integration increases, resistance of these buried bit lines also increases, and hence the ultimate operation speed of the mask ROM is limited. The reason for this is that even by doping the substrate with the highest possible concentration of N-type ions, the ultimate resistivity can only reduced to about 70 to 80 $\Omega/\square$. If, for the sake of decreasing the resistivity of the buried lines, the ion concentration in the doping operation is further increased, punch through between neighboring memory cell bit lines may happen.

SUMMARY OF THE INVENTION

The invention provides a method of manufacturing the bit lines of ROM. The method includes the steps of forming a protective layer and a mask layer sequentially over a substrate, and then patterning the mask layer to form an opening that exposes a portion of the protective layer. Thereafter, spacers are formed on the sidewalls of the opening, and then a portion of the protective layer and the substrate areas exposed by the opening are removed in sequence to form a trench in the substrate. Next, the mask layer, the spacers and the protective layer are all removed. Finally, conductive material is deposited into the trench to form a bit line.

Since bit lines are formed using a damascene method instead of the conventional ion implant method, resistivity of bit lines can be lowered and operating speed of devices can be increased. Moreover, resistivity of a bit line can be decreased by forming a deeper trench. In addition, spacer structures can be used to reduce the outer diameter of the opening so that a trench with a narrower opening can be formed in the substrate. Hence, the ultimate resolution of photolithographic processing operation is relieved, and level of device integration can be further increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
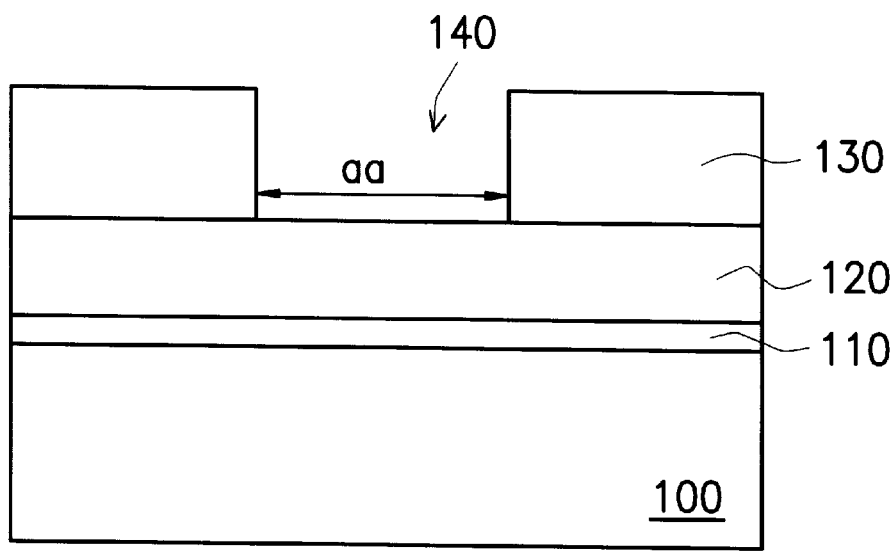
FIGS. 1A through 1E are schematic, cross-sectional views showing the progression of manufacturing steps in fabricating the bit line of a mask ROM according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views showing the progression of manufacturing steps in fabricating the bit line of a mask ROM according to one preferred embodiment of this invention.

As shown in FIG. 1A, a sacrificial oxide layer 110, a first sacrificial layer 120 and a second sacrificial layer 130 are sequentially formed over a substrate 100. The sacrificial oxide layer 110 is formed, for example, by performing a thermal oxidation at about 900° C. The first sacrificial layer 120 and the second sacrificial layer 130 must have big differences in their respective etching rates. For example, if the first sacrificial layer 120 is formed using silicon nitride, the second sacrificial layer 130 is preferably a silicon oxide layer. Both the first sacrificial layer 120 and the second sacrificial layer 130 can be formed using a chemical vapor deposition (CVD) method.

Thereafter, an opening 140 having a diameter aa, which dimension is dictated by the design rule, is formed in the second sacrificial layer 130. The opening 140 is for example, by performing photolithographic and etching operations. Since the first sacrificial layer 120 and the second sacrificial layer 130 have widely different etching rates, the opening 140 will stop at the first sacrificial layer 120.

Figure 1B:
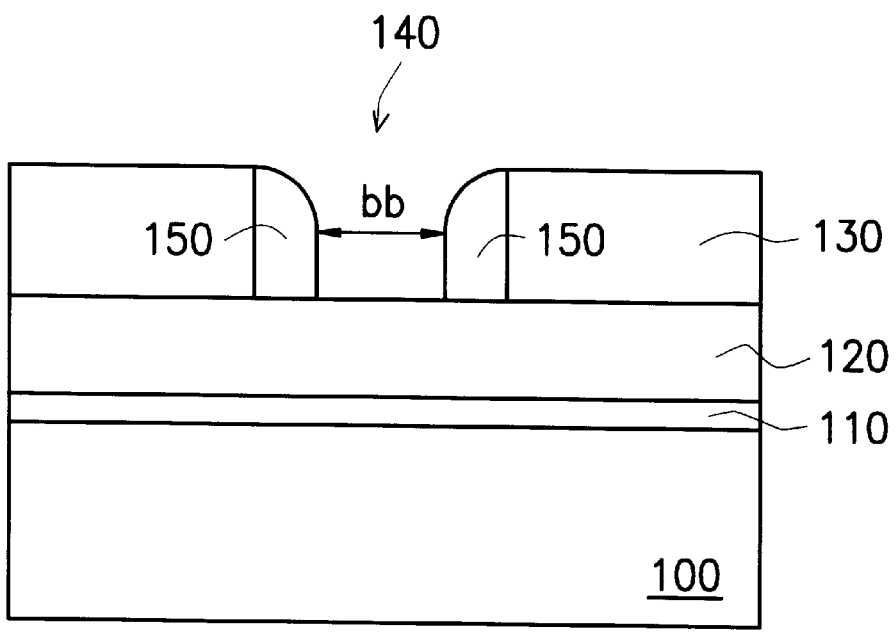

As shown in FIG. 1B, spacers 150 are formed on the sidewalls of the opening 140 so that diameter of the opening 140 shrinks from aa to bb. For example, if aa is about 0.25 $\mu$m, then bb is in the range of about 0.12 $\mu$m to 0.18 $\mu$m. The spacers 150 are formed by first depositing insulation material over the second sacrificial layer and then etching back the insulation layer using an anisotropic etching method. Since the etching must stop at the first sacrificial layer 120, spacer material needs to have a higher etching rate than the first sacrificial layer. Consequently, the spacer is preferably a silicon oxide layer.

Figure 1C:
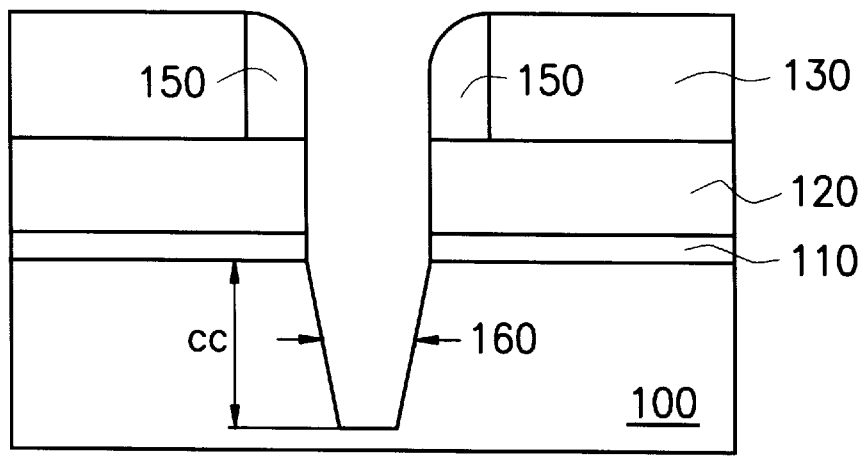

As shown in FIG. 1C, an anisotropic etching operation is carried out to etch into the substrate 100 and to form a trench 160 using the second sacrificial layer 130 and the spacers 150 as a mask. Depth cc of the trench is roughly from about 1 to 5 $\mu$m. As a rule, the deeper the trench 160 is made, the smaller the resistivity of the subsequently formed bit line is.

Figure 1D:
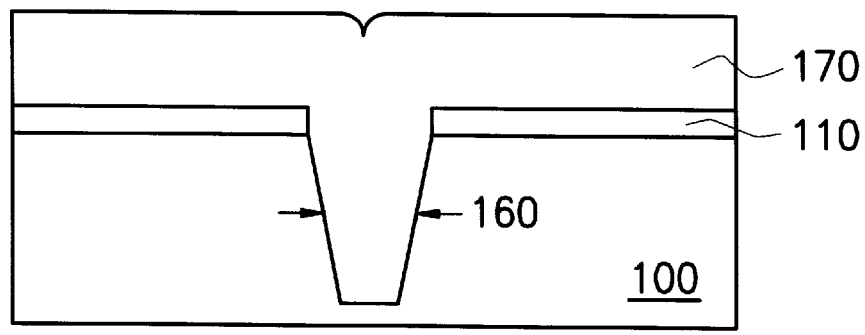

As shown in FIG. 1D, the spacers 150, the second sacrificial layer 130 and the first sacrificial layer 120 are removed. Thereafter, an annealing operation is carried out, for example, at a temperature of about 1000° C. for about 30 minutes so that structural defects generated during the trench-forming operation are reduced. Subsequently, conductive material is deposited into the trench 160 to form a conductive layer 170. The spacers 150, the second sacrificial layer 130 and the first sacrificial layer 120 can be removed using, for example, a wet etching method. Normally, silicon oxide material is removed using hydrofluoric acid solution, whereas silicon nitride material is removed using hot phosphoric acid solution. The conductive layer 170 is preferably a doped polysilicon layer. The doped polysilicon layer is formed, for example, by performing a low-pressure chemical vapor deposition (LPCVD) operation using silane as the reactive gas at a temperature between 600° C. and 650° C. and a pressure of about 0.3 to 0.6 torr.

Figure 1E:
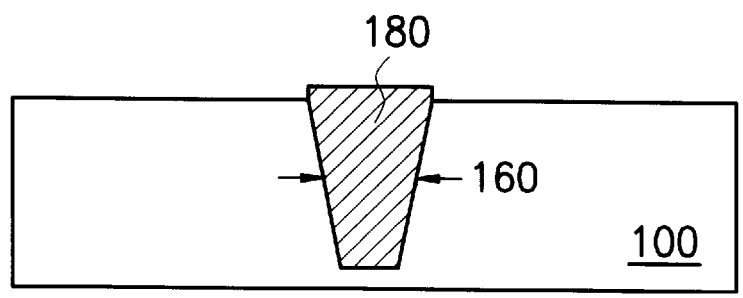

As shown in FIG. 1E, a portion of the conductive layer 170 is removed by etching back method or CMP method so that a bit line 180 composed of the remaining conductive material is formed in the substrate 100. Finally, the sacrificial oxide layer 110 is removing using, for example, hydrofluoric acid solution. If the trench 160 is at the maximum depth of 5 μm, a resistivity as low as about 2.2 Ω can be obtained.

Subsequently, other operations such as forming a gate oxide layer and a gate word line above the substrate are carried out. Since these operations should be familiar to the people working in the semiconductor industry, detailed description is omitted. Note, however, that when thermal oxidation method is used to form the gate oxide layer, heat generated during the process is able to diffuse dopants from the bit line 180 into the surrounding substrate, thus forming a p-n junction. Therefore, junction breakdown voltage of the bit line 180 can remain at a relatively high level.

Some of the steps disclosed in the aforementioned description can beomitted. For example, the formation of the sacrificial oxide layer 110, the first sacrificial layer 120 and the spacers 150 can be eliminated. However, if no sacrificial oxide layer 10 is formed, the second sacrificial layer 130 and the spacers 150 must have etching rates that differ from the substrate 100. In addition, if the spacer-forming step is eliminated, diameter of trench after the etching operation will be bigger, roughly the same as the diameter aa of the opening 140.

In summary, the advantages of the invention as disclosed in the description of this embodiment include:

1. Damascene technique relying on the deposition of conductive material into a trench is used to form the bit lines instead of the conventional ion implant method. Therefore, resistivity of bit lines decreases and the operating speed of devices increases.

2. Resistivity of the bit lines can be somewhat adjusted through controlling the depth of the trench. In general, the deeper the trench, the lower the resistivity will be.

3. Limitations of line width due to the highest resolution attainable using photolithographic process are relieved by the invention. Hence, finer bit lines can be produced and higher integration of devices can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing bit lines in a memory, comprising the steps of:
    providing a substrate;
    forming a protective layer over the substrate;
    forming a mask layer over the protective layer;
    patterning the mask layer to form an opening in the mask layer, wherein the opening exposes a portion of the protective layer, but does not expose the substrate;
    while using the mask layer as a hard mask layer, removing a portion of the exposed protective layer and the substrate to form a trench;
    removing the mask layer and the protective layer after the trench is formed; and
    depositing conductive material into the trench to form a bit line.

2. The method of claim 1, wherein after the step of forming the opening but before the step of forming the trench, further includes forming a spacer on the sidewall of the opening to serve as a part of the hard mask layer, and when removing the mask layer, simultaneously removing the spacer.

3. The method of claim 2, wherein the step of forming the spacers includes depositing silicon oxide.

4. The method of claim 1, wherein the step of forming the protective layer includes depositing silicon nitride by chemical vapor deposition.

5. The method of claim 1, wherein the step of forming the mask layer includes depositing silicon oxide by chemical vapor deposition.

6. The method of claim 1, wherein after the step of removing the mask layer and the protective layer, further includes performing an annealing operation.

7. The method of claim 1, wherein the step of forming the conductive layer includes depositing doped polysilicon by chemical vapor deposition.

8. A method for manufacturing mask ROM, comprising the steps of:
    providing a substrate;
    forming a sacrificial layer over the substrate; patterning the sacrificial layer to form an opening in the sacrificial layer, wherein the opening exposes a portion of the substrate;
    while using the sacrificial layer as a hard mask layer, removing a portion of the exposed substrate to form a trench;
    removing the sacrificial layer after the trench is formed;
    depositing a conductive layer into the trench to form a bit line; and
    forming a word line above the substrate that passes over the bit lines.

9. The method of claim 8, wherein after the step of forming the opening but before the step of forming the trench, further includes forming spacers on the sidewalls of the opening to serve as a part of the hard mask layer, and then removing the spacers at the same time as when the sacrificial layer is removed.

10. The method of claim 8, wherein after the step of removing the sacrificial layer but before the step of forming the bit line, further includes performing an annealing operation.

11. The method of claim 8, wherein the step of forming the conductive layer includes depositing doped polysilicon by chemical vapor deposition.

12. A method for manufacturing mask ROM, comprising the steps of: providing a substrate;
    forming a plurality of in the substrate;
    depositing conductive material into the trenches to form a plurality of bit lines; and
    forming a word line above the substrate that passes over the bit lines.

13. The method of claim 12, wherein the step of forming the trenches further includes the sub-steps of:
    forming a pad oxide layer over the substrate;
    forming a protective layer over the pad oxide layer;
    forming a mask layer over the protective layer;
    patterning the mask layer to form a plurality of openings in the mask layer, wherein each opening exposes a portion of the protective layer;

forming a plurality of spacers on the sidewalls of the openings;

removing a portion of the exposed protective layer, a portion of the pad oxide layer and a portion of the substrate to form the plurality of trenches in the substrate, while using the mask layer and the spacers as a hard mask layer;

removing the mask layer and the spacers; and removing the pad oxide layer before the step of forming the word line and after the step of the forming the plurality of bit lines.

14. The method of claim 12, wherein after the step of forming the trench but before the step of forming the bit lines further includes performing an annealing operation.

15. The method of claim 2, further comprising:

forming a pad oxide layer over the substrate before the step of forming the protective layer.

simultaneously patterning the protective layer and the pad oxide layer when patterning the mask layer;

simultaneously removing a portion of the pad oxide layer when removing the portion of the exposed protective layer; and removing the pad oxide layer after the step of depositing conductive material.

16. The method of claim 9, further comprising:

forming a pad oxide layer over the substrate and an additional sacrificial layer over the pad oxide layer before the step of forming the sacrificial layer;

simultaneously patterning the additional sacrificial layer and the pad oxide layer when patterning the mask layer;

removing the additional sacrificial layer after the step of removing the sacrificial layer and the spacers and after depositing conductive material into the trench; and removing pad oxide layer after the step of depositing conductive material and after forming the word line.

17. The method of claim 16, wherein the step of forming the spacers and the sacrificial layer includes depositing silicon oxide by chemical vapor deposition, wherein the step of forming the additional sacrificial layer includes depositing silicon nitride by chemical vapor deposition.

18. The method of claim 13, wherein the step of forming the spacers and the mask layer includes depositing silicon oxide by chemical vapor deposition, and the step of forming the additional protective layer includes depositing silicon nitride by chemical vapor deposition.

19. The method of claim 14, wherein the step of forming the plurality of bit lines comprises:

depositing a conductive material layer over the pad oxide layer and into the trench; and removing a portion of the conductive material layer over the pad oxide layer by chemical mechanical polishing.

20. The method of claim 19, wherein the step of forming the conductive material layer comprises depositing doped polysilicon by chemical vapor deposition.

* * * * *